(12) United States Patent
Huo et al.

(10) Patent No.: US 8,269,268 B2
(45) Date of Patent: Sep. 18, 2012

(54) CHARGE TRAP FLASH MEMORY DEVICE AND MEMORY CARD AND SYSTEM INCLUDING THE SAME

(75) Inventors: Zong-liang Huo, Suwon-si (KR); In-seok Yeo, Seoul (KR); Seung-Hyun Lim, Yongin-si (KR); Kyong-hee Joo, Seongnam-si (KR); Jun-kyu Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 656 days.

(21) Appl. No.: 12/080,315

(22) Filed: Apr. 2, 2008

(65) Prior Publication Data
US 2008/0246078 A1    Oct. 9, 2008

(30) Foreign Application Priority Data

Apr. 3, 2007  (KR) ................. 10-2007-0032939

(51) Int. Cl.
*H01L 29/792* (2006.01)

(52) U.S. Cl. .. 257/325; 257/324; 257/326; 257/E29.309

(58) Field of Classification Search .......... 257/324–326, 257/E29.309
See application file for complete search history.

(56) References Cited

U.S. PATENT DOCUMENTS

| 6,413,819 | B1 * | 7/2002 | Zafar et al. | 438/257 |
| 2006/0261401 | A1 * | 11/2006 | Bhattacharyya | 257/316 |
| 2008/0157171 | A1 * | 7/2008 | Majhi et al. | 257/321 |
| 2008/0169501 | A1 * | 7/2008 | Yang et al. | 257/321 |

FOREIGN PATENT DOCUMENTS

| JP | 2005-332924 | 12/2005 |
| KR | 10-2006-0108352 | 10/2006 |
| KR | 10-2006-0116543 | 11/2006 |

OTHER PUBLICATIONS

Machine English translation of KR 10-2006-0116543.*

* cited by examiner

*Primary Examiner* — Allison P Bernstein
(74) *Attorney, Agent, or Firm* — Onello & Mello, LLP (57) ABSTRACT

The device includes: a tunnel insulating layer, a charge trap layer; a blocking insulating layer; and a gate electrode sequentially formed on a substrate. The charge trap layer includes: plural trap layers comprising a first material having a first band gap energy level; spaced apart nanodots, each nanodot being at least partially surrounded by at least one of the trap layers, wherein the nanodots comprise a second material having a second band gap energy level that is lower than the first band gap energy level; and an intermediate blocking layer comprising a third material having a third band gap energy level that is higher than the first band gap energy level, formed between at least two of the trap layers. This structure prevents loss of charges from the charge trap layer and improves charge storage capacity.

12 Claims, 9 Drawing Sheets

CHARGE TRAP FLASH MEMORY DEVICE AND MEMORY CARD AND SYSTEM INCLUDING THE SAME

CROSS-REFERENCE TO RELATED PATENT APPLICATION

This application claims priority to Korean Patent Application No. 10-2007-0032939, filed on Apr. 3, 2007, in the Korean Intellectual Property Office, the disclosure of which is incorporated herein in its entirety by reference.

BACKGROUND OF THE INVENTION

1. Field of the Invention

The present invention relates to a flash memory, and more particularly, to a charge trap flash (CTF) memory device and memory card, and system including the same.

2. Description of the Related Art

In general, non-volatile memory devices are semiconductor memory devices in which data stored therein is not erased even if power supply thereto is stopped. Since the non-volatile memory devices have a high data storage capacity, they have been widely employed in mobile communication systems, memory cards, etc.

In the case of a NAND type flash semiconductor memory device, which is an example of a high capacity non-volatile semiconductor memory device being widely used at present, a gate of a transistor thereof has a structure in which a floating gate that stores charges (which represent data) and a control gate controlling the floating gate are sequentially stacked.

To increase the memory capacity, the size of memory cells in flash semiconductor memory devices has been rapidly reduced. Also, a reduction in the height of the floating gate in a vertical direction is required, due to the reduction in the size of the memory cells. Accordingly, in addition to effectively reducing the height of the memory cells in a vertical direction, memory characteristics of a memory cell, for example, retention characteristics for maintaining stored data for a long time, need to be improved. In addition, disturbance between the memory cells, which can be increased as the size of the memory cells is reduced, needs to be prevented.

To solve the problems, a semiconductor memory device that includes a charge trap layer using an insulating material, instead of the floating gate, for storing charges has been suggested. For example, a Silicon-Oxide-Nitride-Oxide-Silicon (SONOS) structure or a Metal-Oxide-Nitride-Oxide-Silicon (MONOS) structure, which are each formed of silicon nitride ($Si_3N_4$), can be used as the insulating material for storing charges. A charge trap flash (CTF) memory has a structure wherein a threshold voltage shifts when the charges are trapped in the charge trap layer.

The SONOS memory device has a basic structure as follows. A first silicon oxide ($SiO_2$) layer is formed on a semiconductor substrate between a source region and a drain region, and contacts the source region and the drain region. Also, the first silicon oxide layer is a tunnel insulating layer for tunneling charges. A silicon nitride ($Si_3N_4$) layer is formed as a charge trap layer on the first silicon oxide layer. The silicon nitride layer is a material layer in which data is stored and charges having tunneled through the first silicon oxide layer are trapped. A second silicon oxide layer operates as a blocking insulating layer formed on the silicon nitride layer to block movement of the charges. A gate electrode is formed on the second silicon oxide layer. In the charge trap flash memory device, in a program operation, electrons are injected and stored in the charge trap layer. In an erasing operation, holes are injected into the charge trap layer, and the electrons stored in the charge trap layer are removed by recombining the holes and the electrons. However, in the SONOS memory device, dielectric constants of a silicon nitride layer and silicon oxide layers are low, and an electron trap site density is not sufficient in the silicon nitride layer and, as such, the SONOS memory device has a high operating voltage and a low program speed. Also, charge retention duration in a vertical or horizontal direction is not sufficient.

An exemplarily charge trap flash memory device according to the prior art will now be described.

Figure 1A:
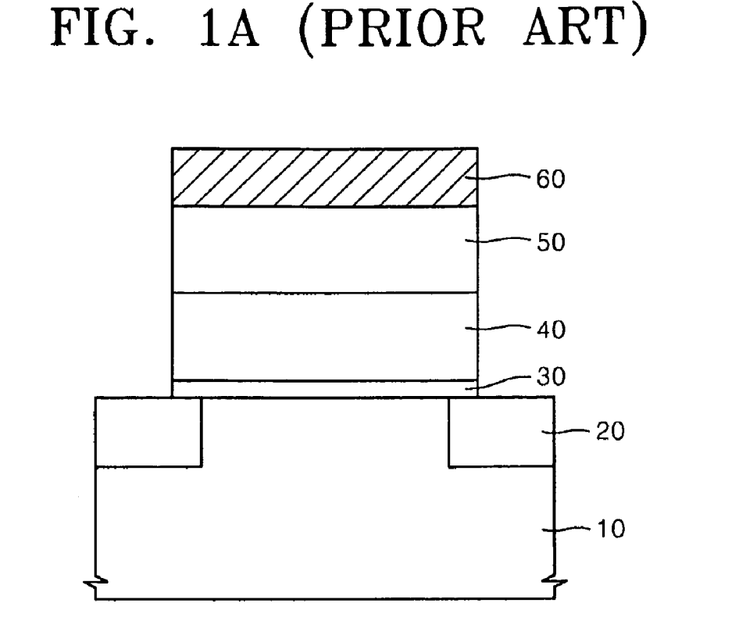
FIGS. 1A and 1B are cross-sectional views of a charge trap flash memory device according to the prior art.
Figure 1B:
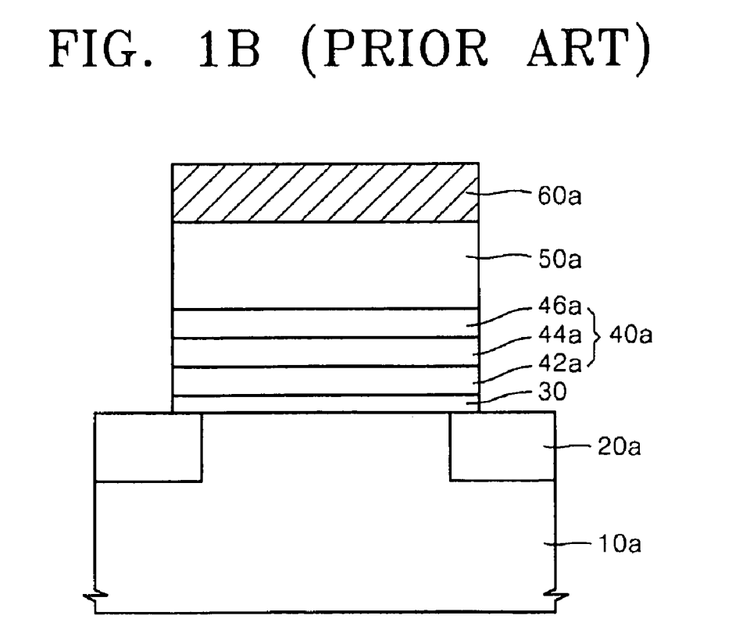

FIGS. 1A and 1B are cross-sectional views of a charge trap flash memory device according to the prior art.

Referring to FIG. 1A, a tunnel oxide layer 30, a charge trap layer 40, a blocking insulating layer 50, and a gate electrode 60 are sequentially formed on a substrate 10 in which a source and drain region 20 are formed. In this case, the charge trap layer 40 is formed of silicon nitride and the blocking insulating layer 50 is formed of an aluminum oxide. The gate electrode 60 is formed of a nitrided tantalum. A charge trap flash memory device having such a structure is a MONOS type device described above and in this case is specifically a Thallium-Aluminum oxide-Nitride-Oxide-Silicon (TANOS) structure.

Referring to FIG. 1B, a tunnel oxide layer 30a, a charge trap layer 40a, a blocking insulating layer 50a, and a gate electrode 60a are sequentially formed on a substrate 10a in which a source and drain region 20a are formed. In this case, the charge trap layer 40a is a stack of three layers, that is, a sequential stack of a first silicon nitride layer 42a, a first aluminum oxide layer 44a, and a second silicon nitride layer 46a. The blocking insulating layer 50a is formed of an aluminum oxide and the gate electrode 60a is formed of a nitrided tantalum. A charge trap flash memory device having such a structure is called a Nitride-Aluminum oxide-Nitride (NAN).

Figure 2A:
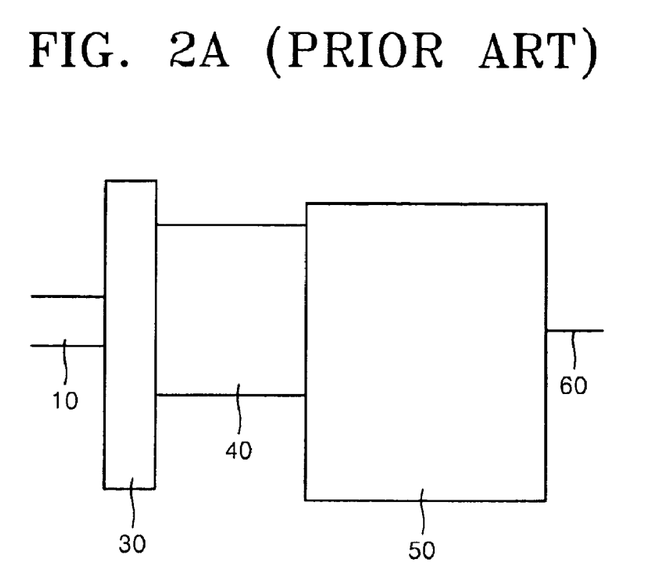
FIGS. 2A and 2B illustrate energy band diagrams of the charge trap flash memory device shown in FIGS. 1A and 1B.
Figure 2B:
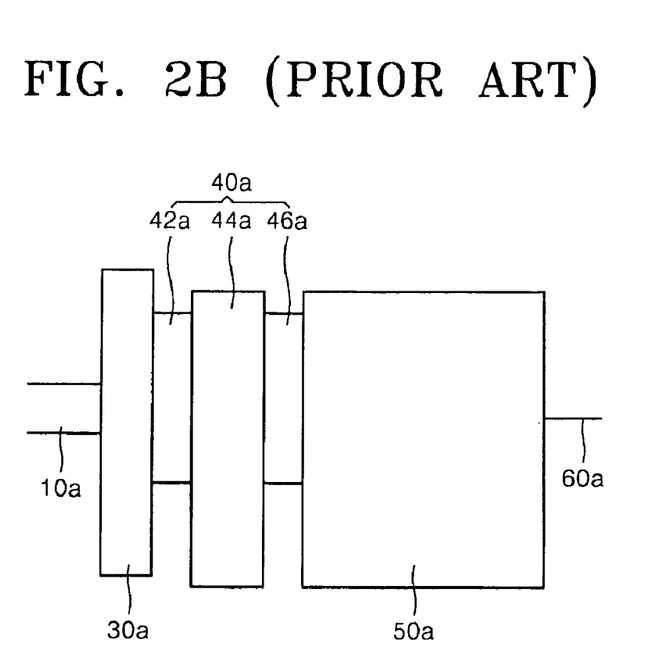

FIGS. 2A and 2B illustrate energy band diagrams of the charge trap flash memory devices shown in FIGS. 1A and 1B, respectively.

Referring to FIGS. 2A and 2B, materials used to form the substrates 10 and 10a, the tunnel oxide layers 30 and 30a, the charge trap layers 40 and 40a, the insulating layers 50 and 50a, and the gate electrode 60 and 60a each have their own energy band gaps. A potential barrier exists in interfaces between adjacent structures due to the difference between the energy band gaps.

In the TANOS structure illustrated in FIGS. 1A and 2A, charges are trapped in a deep trap level of the charge trap layer 40 formed of a silicon nitride. Accordingly, a lateral charge spreading, which is a cause of charge loss, is small. On the other hand, the TANOS structure has a high erasing voltage and poor retention characteristics.

In the NAN structure illustrated in FIGS. 1B and 2B, the aluminum oxide layer 44a is interposed between the charge trap layers 42a and 46a formed of a silicon nitride. An erasing voltage and reliability can be improved in the NAN structure, but there is a disadvantage in that it has a low program voltage and high threshold voltage disturbance characteristics.

SUMMARY OF THE INVENTION

In accordance with aspects of the present invention, there is provided a charge trap flash memory device having a structure that can prevent charges stored in a charge trap layer from being lost and can improve a charge storage capacity.

Also in accordance with aspects of the present invention, there is provided a method that can be used to simply and easily manufacture the charge trap flash memory device having a structure that can prevent charges stored in a charge trap layer from being lost and can improve a charge storage capacity.

Also in accordance with aspects of the present invention, there is provided a memory card and system including the above-described memory device and method.

According to an aspect of the present invention, there is provided a charge trap flash memory device including: a tunnel insulating layer formed on a semiconductor substrate; a charge trap layer formed on the tunnel insulating layer; a blocking insulating layer formed on the charge trap layer; and a gate electrode formed on the blocking insulating layer. The charge trap layer includes: a plurality of trap layers including a first material having a first band gap energy level; a plurality of nanodots spaced apart from one another, each of which is at least partially surrounded by at least one of the trap layers, the nanodots including a second material having a second band gap energy level that is lower than the first band gap energy level; and an intermediate blocking layer formed between at least two of the plurality of trap layers, the intermediate blocking layer including a third material having a third band gap energy level that is higher than the first band gap energy level.

At least one of the trap layers can include a first trap layer formed to contact the tunnel insulating layer, wherein the first trap layer can include a plurality of nanodots formed on the tunnel insulating layer and surrounded by the first material of the first trap layer.

At least one of the trap layers can include: a first trap layer formed to contact the tunnel insulating layer and a second trap layer formed on the first trap layer; the first trap layer including a first group of the nanodots formed on the tunnel insulating layer, the first group of nanodots surrounded by the first material of the first trap layer; the second trap layer including a second group of the nanodots that are substantially completely surrounded by the first material.

At least one of the trap layers can include: a third trap layer formed to be spaced apart from the tunnel insulating layer and formed to contact the blocking insulating layer; the third trap layer including nanodots formed on the blocking insulating layer and surrounded by the first material of the third trap layer.

The first material of the plurality of trap layers can comprise at least one material selected from a group consisting of $SiO_2$, SiON, $Si_3N_4$, Si rich nitride (SRN), $HfO_2$, HfSiO, HfSiON, HfON HfAlO, $Al_2O_3$, and AlN.

The nanodots can comprise one of metals, semiconductors, and High-K materials.

The nanodots can comprise at least one material selected from a group consisting of: metal nano-particles made of at least one material selected from Pt, Pd, Ni, Ru, Co, Cr, Mo, W, Mn, Fe, Ru, Os, Ph, Ir, Ta, Au, Ag, and an alloy thereof; IV group semiconductor nano-particles made of a compound selected from a group of single-element compounds including Si and Ge and a group of two-element compounds including SiC and SiGe; II-VI group compound semiconductor nano-particles made of a compound selected from a group of two-element compounds including CdSe, CdTe, ZnS, ZnSe, ZnTe, ZnO, HgS, HgSe or HgTe, a group of three-element compounds including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS or HgZnSe, and a group of four-element compounds including HgZnTe, CdZnSeS, CdZnSeTe, CdZnSTe, CdHgSeS, CdHgSeTe, CdHgSTe, HgZnSeS, HgZnSeTe or HgZnSTe; III-V group compound semiconductor nano-particles made of a compound selected from a group of two-element compounds including GaN, GaP, GaAs, GaSb, AlN, AlP, AlAs, AlSb, InN, InP, InAs or InS, a group of three-element compounds including GaNP, GaNAs, GaNSb, GaPAs, GaPSb, AlNP, AlNAs, AlNSb, AlPAs, AlPSb, InNP, InNAs, InNSb, InPAs, InPSb or GaAlNP, and a group of four-element compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs or InAlPSb; IV-VI group compound semiconductor nano-particles made of a compound selected from a group of two-element compounds including SnS, SnSe, SnTe, PbS, PbSe or PbTe, a group of three-element compounds including SnSeS, SnSeTe, SnSTe, PbSeS, PbSeTe, PbSTe, SnPbS, SnPbSe or SnPbTe, and a group of four-element compounds including SnPbSSe, SnPbSeTe or SnPbSTe; and a High-K material selected from $SiO_2$, $HfO_2$, $ZrO_2$, $Al_2O_3$, HfSiO, HfSiON, HfON and HfAlO.

Each of the nanodots can further include a nitride layer on the surface of the nanodots.

The intermediate blocking layer can include a material selected from a group consisting of $Al_2O_3$, $SiO_2$, $HfO_2$, $ZrO_2$, $Ta_2O_5$, LaO, LaAlO, LaHfO and HfAlO, or a combination thereof.

The tunnel insulating layer can include a material selected from a group consisting of $SiO_2$, $Si_3N_4$, SiON, $HfO_2$, HfSiO, $Al_2O_3$, and $ZrO_2$, or a combination thereof.

The blocking insulating layer can include a material selected from a group consisting of $Al_2O_3$, $SiO_2$, $HfO_2$, $ZrO_2$, $Ta_2O_5$, LaO, LaAlO, LaHfO, and HfAlO, or a combination thereof.

The gate electrode can include a material selected from a group consisting of Al, Ru, TaN, TiN, W, WN, HfN and tungsten silicide, or a combination thereof.

According to another aspect of the present invention, there is provided a method of manufacturing a charge trap flash memory device including: forming a tunnel insulating layer on a semiconductor substrate; forming a charge trap layer on the tunnel insulating layer, the charge trap layer including a plurality of trap layers each including a first material having a first band gap energy level, a plurality of nanodots spaced apart from one another, each of which is surrounded by at least one of the trap layers, the nanodots including a second material having a second band gap energy level that is lower than the first band gap energy level, and an intermediate blocking layer formed between at least two of the trap layers, the intermediate blocking layer including a third material having a third band gap energy level that is higher than the first band gap energy level; forming a blocking insulating layer on the charge trap layer; and forming a gate electrode on the blocking insulating layer.

In some embodiments, forming the charge trap layer can include: forming a plurality of first nanodots spaced apart from one another on the tunnel insulating layer; and forming a first trap layer contacting the tunnel insulating layer and surrounding the first nanodots with the first material of the first trap layer. The forming of the first nanodots can include: forming a plurality of nanodot seeds spaced apart from one another on the tunnel insulating layer; and forming the first nanodots spaced apart from one another by growing the nanodot seeds.

Also, forming the first nanodot can further include: performing a nitriding treatment on the surface of the first nanodots after forming the first nanodots.

In some embodiments, forming the charge trap layer can include: forming a plurality of second nanodots spaced apart from one another on the first trap layer; and forming a second trap layer on the second nanodots and the first trap layer using the first material so that the plurality of second nanodots are substantially completely surrounded by the first material.

In some embodiments, forming the charge trap layer can include: forming a plurality of third nanodots spaced apart from one another on the blocking insulating layer; forming a third trap layer contacting the blocking insulating layer and surrounding the third nanodots with the first material of the third trap layer.

The trap layers can be formed using low pressure chemical vapor deposition (LPCVD), atomic layer deposition (ALD), or plasma enhanced chemical vapor deposition (PECVD).

The nanodots can be formed using LPCVD, ion implantation, or ALD.

The intermediate blocking layer can be formed using physical vapor deposition (PVD), chemical vapor deposition (CVD), or ALD.

The trap layers can include a material selected from a group consisting of $SiO_2$, SiON, $Si_3N_4$, Si rich nitride (SRN), $HfO_2$, HfSiO, HfSiON, HfON HfAlO, $Al_2O_3$, and AlN.

The nanodots can include at least one material selected from a group consisting of metal nano-particles made of at least one material selected from Pt, Pd, Ni, Ru, Co, Cr, Mo, W, Mn, Fe, Ru, Os, Ph, Ir, Ta, Au, Ag, and an alloy thereof; IV group semiconductor nano-particles made of a compound selected from a group of single-element compounds including Si and Ge and a group of two-element compounds including SiC and SiGe; II-VI group compound semiconductor nano-particles made of a compound selected from a group of two-element compounds including CdSe, CdTe, ZnS, ZnSe, ZnTe, ZnO, HgS, HgSe or HgTe, a group of three-element compounds including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS or HgZnSe, and a group of four-element compounds including HgZnTe, CdZnSeS, CdZnSeTe, CdZnSTe, CdHgSeS, CdHgSeTe, CdHgSTe, HgZnSeS, HgZnSeTe or HgZnSTe; III-V group compound semiconductor nano-particles made of a compound selected from a group of two-element compounds including GaN, GaP, GaAs, GaSb, AlN, AlP, AlAs, AlSb, InN, InP, InAs or InS, a group of three-element compounds including GaNP, GaNAs, GaNSb, GaPAs, GaPSb, AlNP, AlNAs, AlNSb, AlPAs, AlPSb, InNP, InNAs, InNSb, InPAs, InPSb or GaAlNP, and a group of four-element compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs or InAlPSb; IV-VI group compound semiconductor nano-particles made of a compound selected from a group of two-element compounds including SnS, SnSe, SnTe, PbS, PbSe or PbTe, a group of three-element compounds including SnSeS, SnSeTe, SnSTe, PbSeS, PbSeTe, PbSTe, SnPbS, SnPbSe or SnPbTe, and a group of four-element compounds including SnPbSSe, SnPbSeTe or SnPbSTe; and a High-K material selected from $SiO_2$, $HfO_2$, $ZrO_2$, $Al_2O_3$, HfSiO, HfSiON, HfON and HfAlO.

The intermediate blocking layer can include a material selected from a group consisting of $Al_2O_3$, $SiO_2$, $HfO_2$, $ZrO_2$, $Ta_2O_5$, LaO, LaAlO, LaHfO and HfAlO, or a combination thereof.

According to another aspect of the present invention, there is provided a memory card including one or more flash memory device and a controller configured to control the memory, including sending and receiving data to and from the memory. The one or more flash memory device including: a tunnel insulating layer formed on a semiconductor substrate; a charge trap layer formed on the tunnel insulating layer; a blocking insulating layer formed on the charge trap layer; and a gate electrode formed on the blocking insulating layer. The charge trap layer includes: a plurality of trap layers including a first material having a first band gap energy level; a plurality of nanodots spaced apart from one another, each of which is at least partially surrounded by at least one of the trap layers, the nanodots including a second material having a second band gap energy level that is lower than the first band gap energy level; an intermediate blocking layer formed between at least two of the trap layers, the intermediate blocking layer including a third material having a third band gap energy level that is higher than the first band gap energy level.

According to another aspect of the present invention, there is provided a memory system including: a memory including one or more flash memory device, a processor configured to communicate with the memory through a bus; and an input/output apparatus configured to communicate with the bus. The one or more flash memory including: a tunnel insulating layer formed on a semiconductor substrate; a charge trap layer formed on the tunnel insulating layer; a blocking insulating layer formed on the charge trap layer; and a gate electrode formed on the blocking insulating layer. The charge trap layer includes: a plurality of trap layers including a first material having a first band gap energy level; a plurality of nanodots spaced apart from one another, each of which is at least partially surrounded by at least one of the trap layers, the nanodots including a second material having a second band gap energy level that is lower than the first band gap energy level; an intermediate blocking layer formed between at least two of the trap layers, the intermediate blocking layer including a third material having a third band gap energy level that is higher than the first band gap energy level.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION

Hereinafter, aspects of the present invention will be described by explaining illustrative embodiments in accordance therewith, with reference to the attached drawings. While describing these embodiments, detailed descriptions of well-known items, functions, or configurations are typically omitted for conciseness.

The invention can, however, be embodied in many different forms and should not be construed as being limited to the embodiments set forth herein; rather, these embodiments are provided so that this disclosure will be thorough and complete, and will fully convey the concept of the invention to those skilled in the art. It will also be understood that when a layer is referred to as being "on" another layer or substrate, it can be directly on the other layer or substrate, or intervening elements can also be present. In the drawings, the thicknesses sizes of layers and regions are exaggerated for clarity. Like reference numerals in the drawings denote like elements, and thus their description will be omitted. The words "and/or" used in this disclosure includes any and all combinations of one or more of the associated listed items.

Also, though terms like a first and a second are used to describe various elements, components, regions, layers, and/or portions in various embodiments of the present invention, the elements, components, regions, layers, and/or portions should not be limited by these terms. These terms are only used to distinguish one element, component, region, layer, or portion from another. Therefore, a first element, component, region, layer, or portion discussed below could be termed a second element, component, region, layer, or portion without departing from the teachings of the present invention.

Figure 3:
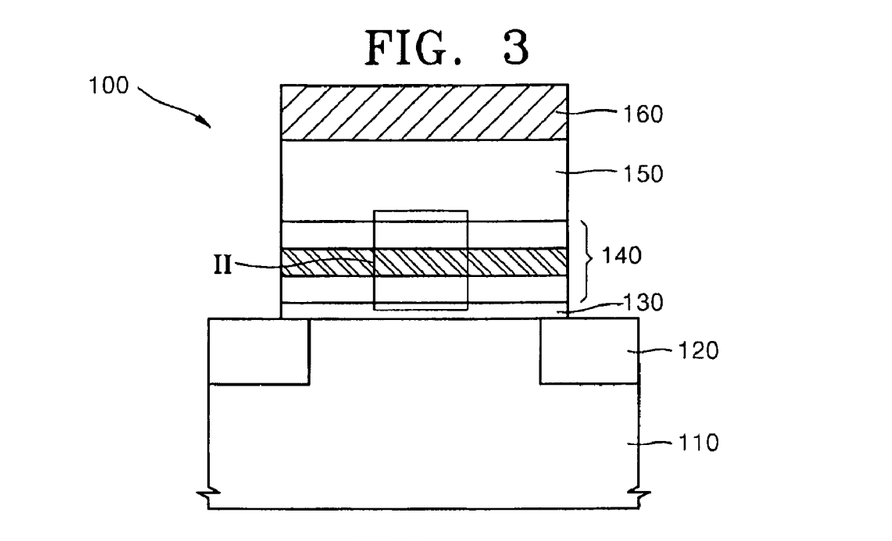
FIG. 3 is an embodiment of a schematic cross-sectional view of a charge trap flash memory device according to one aspect of the present invention.

FIG. 3 is a schematic cross-sectional view of an embodiment of a charge trap flash memory device 100 according to an aspect of the present invention.

Referring to FIG. 3, the charge trap flash memory device 100 has a structure in which a plurality of layers are stacked on a semiconductor substrate 110, including impurity regions 120 doped with a conductive impurity. Each impurity region 120 can be used as a source or drain region.

The stacked structure is formed by sequentially stacking a tunnel insulating layer 130, a charge trap layer 140, a blocking insulating layer 150, and a gate electrode 160 on the semiconductor substrate 110.

The tunnel insulating layer 130 is formed on the semiconductor substrate 110 so as to contact with the impurity regions 120. The tunnel insulating layer 130 can be formed as a single-layer structure or a multi-layer structure having different energy band gaps. The tunnel insulating layer 130 can include a material selected from the group consisting of $SiO_2$, $Si_3N_4$, SiON, $HfO_2$, HfSiO, $Al_2O_3$, and $ZrO_2$, or a combination thereof.

The blocking insulating layer 150 can be formed as a single-layer structure or a multi-layer structure having different energy band gaps. The blocking insulating layer 150 can be formed of a material having a relatively high dielectric constant, for example, a material known as a "High-K" material. For example, the blocking insulating layer 150 can include a material selected from the group consisting of $Al_2O_3$, $SiO_2$, $HfO_2$, $ZrO_2$, $Ta_2O_5$, LaO, LaAlO, LaHfO and HfAlO, or a combination thereof. As a case in point, instead of forming the blocking insulating layer 150 of a silicon oxide layer, it can be formed of an aluminum oxide layer ($Al_2O_3$) having a higher dielectric constant, resulting in a program speed and retention characteristics improvement. The gate electrode 160 can include a material selected from the group consisting of Al, Ru, TaN, TiN, W, WN, HfN and tungsten silicide, or a combination thereof.

Figure 4A:
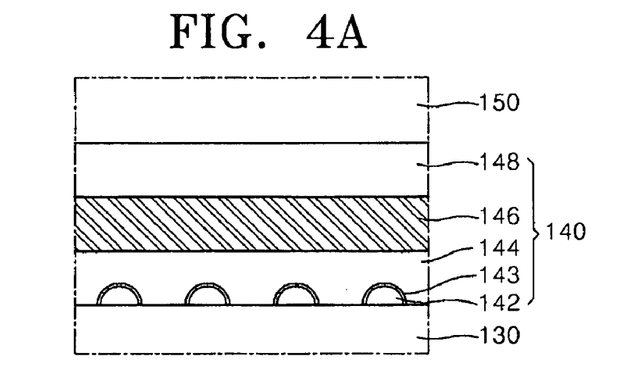
FIGS. 4A through 4C are cross-sectional views of an exemplary embodiment of a charge trap layer structure of the charge trap flash memory device shown in FIG. 3, according to an aspect of the present invention.
Figure 4B:
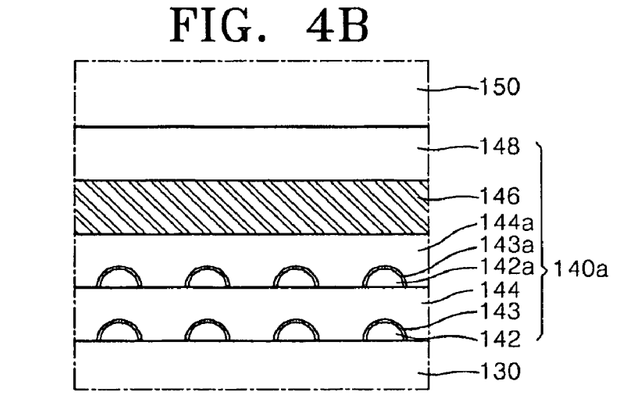
Figure 4C:
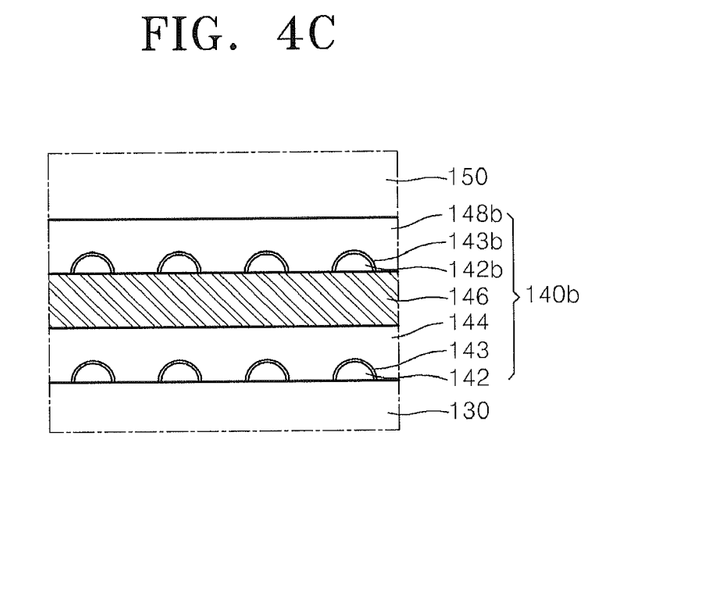

FIG. 4A through 4C are enlarged cross-sectional views of a portion II of FIG. 1 more particularly illustrating an embodiment of a structure of the charge trap layer 140 of the charge trap flash memory device 100 illustrated in FIG. 3.

Referring to FIG. 4A, the charge trap layer 140 includes a plurality of trap layers, that is, a lower trap layer 144, an upper trap layer 148, and an intermediate blocking layer 146 interposed between the lower trap layer 144 and the upper trap layer 148. The lower trap layer 144 is formed on the tunnel insulating layer 130 and includes a plurality of nanodots 142.

The lower trap layer 144 and the upper trap layer 148 include a first material having a first band gap energy level. For example, the first material can include at least one material selected from the group consisting of $SiO_2$, SiON, $Si_3N_4$, Si rich nitride (SRN), $HfO_2$, HfSiO, HfSiON, HfON HfAlO, $Al_2O_3$ and AlN. Here, the SRN layer denotes a layer having a greater atomic ratio of Si to N than stoichiometric atomic ratio of Si to N in the $Si_3N_4$ layer. The lower trap layer 144 and the upper trap layer 148 can be formed of the same material. Also, the lower trap layer 144 and the upper trap layer 148 can be formed using low pressure chemical vapor deposition (LPCVD), atomic layer deposition (ALD), or plasma enhanced chemical vapor deposition (PECVD), as examples.

The nanodots 142 formed on lower trap layer 144 are spaced apart from one another, wherein at least a part of each of the nanodots 142 is surrounded. The nanodots 142 include a second material having a second band gap energy level that is lower than the first level band gap energy level, which is an energy level of the lower trap layer 144. The second material can include metals, semiconductors, or a High-K material. For example, the nanodots 142 can include at least one material selected from a group consisting of: metal nano-particles made of at least one material selected from Pt, Pd, Ni, Ru, Co, Cr, Mo, W, Mn, Fe, Ru, Os, Ph, Ir, Ta, Au, Ag and an alloy thereof; IV group semiconductor nano-particles made of a compound selected from a group of single-element compounds including Si and Ge and a group of two-element compounds including SiC and SiGe; II-VI group compound semiconductor nano-particles made of a compound selected from a group of two-element compounds including CdSe, CdTe, ZnS, ZnSe, ZnTe, ZnO, HgS, HgSe or HgTe, a group of three-element compounds including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS or HgZnSe, and a group of four-element compounds including HgZnTe, CdZnSeS, CdZnSeTe, CdZnSTe, CdHgSeS, CdHgSeTe, CdHgSTe, HgZnSeS, HgZnSeTe or HgZnSTe; III-V group compound semiconductor nano-particles made of a compound selected from a group of two-element compounds including GaN, GaP, GaAs, GaSb, AlN, AlP, AlAs, AlSb, InN, InP, InAs or InS, a group of three-element compounds including GaNP, GaNAs, GaNSb, GaPAs, GaPSb, AlNP, AlNAs, AlNSb, AlPAs, AlPSb, InNP, InNAs, InNSb, InPAs, InPSb or GaAlNP, and a group of four-element compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs or InAlPSb; IV-VI group compound semiconductor nano-particles made of a compound selected from a group of two-element compounds including SnS, SnSe, SnTe, PbS, PbSe or PbTe, a group of three-element compounds including SnSeS, SnSeTe, SnSTe, PbSeS, PbSeTe, PbSTe, SnPbS, SnPbSe or SnPbTe, and a group of four-element compounds including SnPbSSe, SnPbSeTe or SnPbSTe; and a High-K material selected from $SiO_2$, $HfO_2$, $ZrO_2$, $Al_2O_3$, HfSiO, HfSiON, HfON and HfAlO. The two-element compound, the three-element compound, or the four-element compound can exist in particles in a uniform concentration, or can exist in the particles in a slightly different concentration distribution. Since the nanodots 142 have a relatively high work function, they can stably store electrons transmitted from an electrode. Also, the nanodots 142 can include a High-K material such as $HfO_2$, $ZrO_2$ and $Si_3N_4$.

A surface nitride layer 143 can be formed on the surface of the nanodots 142, if necessary. The surface nitride layer 143 provides spaces between the nanodots 142 so as to prevent the nanodots 142 from being crumpled and to decrease a leakage current.

Referring to FIG. 4A, the lower trap layer 144 is formed to contact the tunnel insulating layer 130. The nanodots 142 are surrounded by the tunnel insulating layer 130 and the lower trap layer 144, and are arranged in the lower trap layer 144 to be on the same horizontal plane. Each of the nanodots 142 is in the form of a hemisphere. However, the shape and state of arrangement are exemplary only, and it is not limited thereto. The nanodots 142 can be formed in the lower trap layer 144. Each of the nanodots 142 can have a particle diameter in the range of several nanometers through several hundreds of nanometers. The nanodots 142 can be formed using LPCVD, ion implantation or ALD, and can be formed by performing further heat-treatment, if necessary.

The intermediate blocking layer 146 interposed between the lower trap layer 144 and an upper trap layer 148 partially blocks a charge-transfer. In order to achieve this function, the intermediate blocking layer 146 includes a third material having a third band gap energy level higher than the first band gap energy level, which is a band gap energy of the lower trap layer 144 and the upper trap layer 148. For example, the intermediate blocking layer 146 can include a material selected from the group consisting of $Al_2O_3$, $SiO_2$, $HfO_2$, $ZrO_2$, $Ta_2O_5$, LaO, LaAlO, LaHfO and HfAlO, or a combination thereof.

FIG. 4B is a modified example of the structure of FIG. 4A and is a cross-sectional view illustrating a structure of another embodiment of a charge trap layer 140a that can be used in the charge trap flash memory device 100, according to aspect of the present invention.

A structure of the charge trap layer 140a shown in FIG. 4B is the same as the structure of the charge trap layer 140 shown in FIG. 4A, except that the lower trap layer 144a including a plurality of nanodots 142a is further included. Therefore, the charge trap layer 140a includes two lower trap layers 144 and 144a in FIG. 4B. However, this structure is exemplary only and is not limited thereto, and in other embodiment more than two lower trap layers can be formed. Each of the nanodots 142a formed in the additional lower trap layer 144a is substantially completely surrounded by a first material used to form the lower trap layers 144 and 144a. Here, the additional lower trap layer 144a can be formed of the same material as the material used to form the lower trap layer 144. Also, the nanodots 142a formed in the additional lower trap layer 144a can be formed of the same material as the material forming the aforementioned nanodots 142. As described above, a surface nitride layer 143a can be formed on a surface of the nanodots 142a, if necessary.

FIG. 4C is a cross-sectional view illustrating another exemplary embodiment of a structure of a charge trap layer 140a that can be used in the charge trap flash memory device 100, according to an aspect of the present invention, and is a modified version of the structure of FIG. 4A.

A structure of the charge trap layer 140b of FIG. 4C is the same as the structure of the charge trap layer 140 of FIG. 4A, except that an upper trap layer 148b including a plurality of nanodots 142b is further included. The nanodots 142b formed in the upper trap layer 148b are surrounded by a first material and a blocking insulating layer 150. The nanodots 142b can be formed of the same material as the material used to form the nanodots 142 described above. Also, as described above, a surface nitride layer 143b can be formed on a surface of the nanodots 142b, if necessary.

Although it is not shown in the drawings, various modified examples of the charge trap layer 140 can be realized by combining the charge trap layers shown in FIGS. 4A through 4C. For example, the nanodots 142 can be formed on the upper trap layer 148 not on the lower trap layer 144. In this case, the upper trap layer 148 can be formed as a multi-layer structure. Also, the lower trap layer 144 and the upper trap layer 148 can both include the nanodots 142 and each can be formed as a multi-layer structure. The aforementioned charge trap layer 140 is exemplary only, and the invention is not limited thereto.

Figure 5:
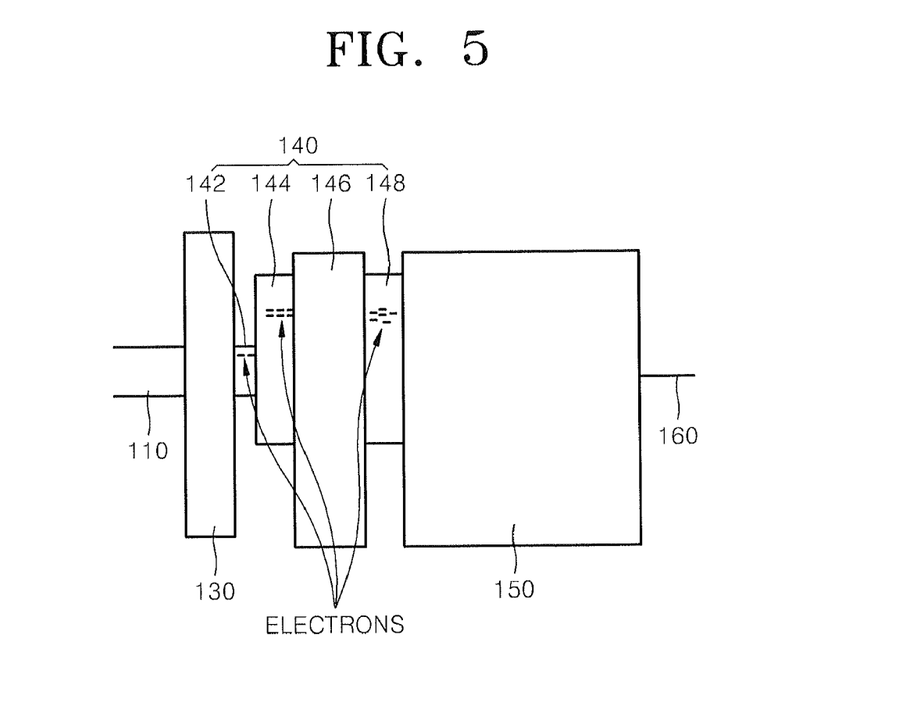
FIG. 5 is an energy band diagram of the charge trap flash memory device of FIG. 3 including the charge trap layer shown in FIG. 4A.

FIG. 5 illustrates an energy band diagram of the charge trap flash memory device 100 of FIG. 3 including the charge trap layer 140 shown in FIG. 4A.

Referring to FIG. 5, by forming a plurality of nanodots 142 having a band gap energy that is lower than a lower trap layer 144 at a location close to a tunnel insulating layer 130, electrons are captured at a low trap level, thereby increasing a charge trap energy. Thus, a charge trap site increases in a charge trap layer 140, thereby improving reliability of the charge trap flash memory device and retention characteristics of the charge trap layer 140.

In particular, when the tunnel insulating layer 130, the lower trap layer 144, and the nanodots 142 are respectively formed of a silicon oxide layer, a silicon nitride layer, and silicon, the nanodots 142 have a trap level about 3 eV deeper than a conduction band of the silicon oxide layer used to form the tunnel insulating layer 130, and have a trap level about 1 eV-2 eV deeper than the conduction band of a silicon nitride layer of the lower trap layer 144. Since charges trapped in the charge trap layer 140 are discontinuously distributed by the nanodots 142, even if defects occur in the tunnel insulating layer 130, a charge loss occurs only around the defects, and it does not influence the entire the charge trap layer 140.

As described above, the nanodots 142 having a band gap energy that is lower than the lower trap layer 144 can work as a potential well. The potential wells can prevent a charge loss from being generated when charges are thermally activated by a program operation flow into the tunnel insulating layer 130.

The lower trap layer 144 or the upper trap layer 148 makes the nanodots 142 isolated from each other, accordingly forming the nanodots 142 with a comparatively high density. Thus, a charge storage capacity of the charge trap flash memory device can be improved. In particular, as described above, the charge storage capacity can be more improved by forming the lower trap layer 144 and/or the upper trap layer 148 including the nanodots 142 as a multi-layer.

A charge loss generated when trapped charges flow through a blocking insulating layer 150 can be prevented by forming the lower trap layer 144 and/or the upper trap layer 148 so as to surround the nanodots 142. In particular, when the blocking insulating layer 150 is formed of a metal oxide layer such as $Al_2O_3$, characteristic deterioration occurring due to oxidization of the surface of the nanodots 142 while forming the blocking insulating layer 150 can be prevented.

The intermediate blocking layer 146, which is interposed between the lower trap layer 144 and the upper trap layer 148 and has a relatively high energy level, can prevent a lateral charge spreading which is a defect that can be caused by the nanodots 142. That is, charges can easily transfer by a local connecting layer that can be formed by forming minute particles and by a narrow storage location of the nanodots 142, and accordingly, the charges can move between the cells of the charge trap flash memory device. Therefore, the lateral charge spreading can be prevented by storing a part of charges trapped by the intermediate blocking layer 146 in the upper trap layer 148. In addition, the intermediate blocking layer 146 can improve a program speed and erase speed.

FIGS. 6A through 6I are cross-sectional views sequentially illustrating an embodiment of a method of manufacturing the charge trap flash memory device according to the exemplary embodiment illustrated in FIGS. 3 and 4A.

Figure 6A:
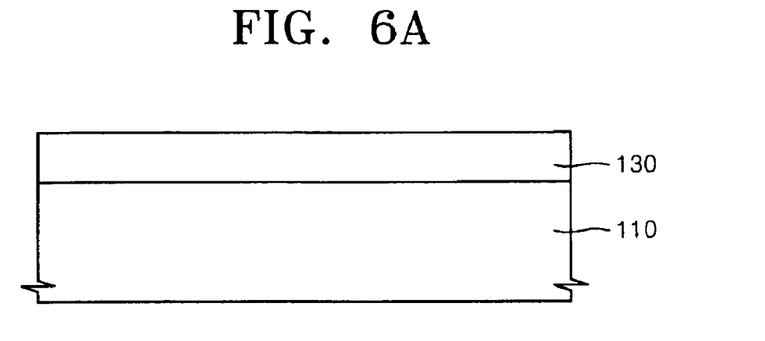
FIGS. 6A through 6I are cross-sectional views sequentially illustrating an embodiment of a method of manufacturing a charge trap flash memory device according to an aspect of the present invention.

Referring to FIG. 6A, a tunnel insulating layer 130 is formed on a semiconductor substrate 110. The tunnel insulating layer 130 can be formed as a single-layer structure or a multi-layer structure having different energy band gaps from one another. The tunnel insulating layer 130 can include a material selected from a group consisting of $SiO_2$, $Si_3N_4$, SiON, $HfO_2$, HfSiO, $Al_2O_3$, and $ZrO_2$, or a combination thereof. The tunnel insulating layer 130 can be formed using thermal oxidization, CVD, or ALD, and can have a thickness in the range of about 2 nm-10 nm.

Figure 6B:
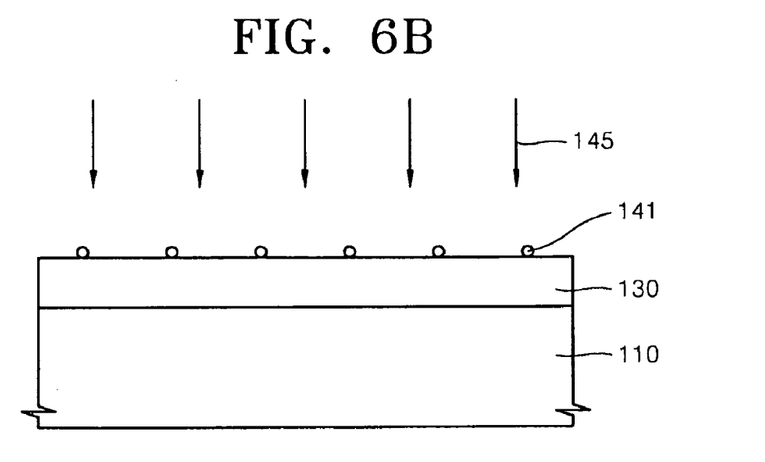

Referring to FIG. 6B, a plurality of nanodot seeds 141, which are spaced apart from one another, are formed by applying a nanodot source gas 145 onto the tunnel insulating layer 130. The nanodot seeds 141 are grown in a subsequent process to form nanodots 142. A material used to form the nanodot seeds 141 can vary depending on a material used to form the nanodots 142.

The case in which the nanodot seeds 141 are formed of silicon will be described as one possible example. For example, the nanodot seeds 141 formed of silicon can be formed by applying a silicon source gas at a temperature in the range of about 500 C-600 C and at a pressure, for example, in the range of 0.1-10 Torr for about 1 min-2 min onto the tunnel insulating layer 130. The silicon source gas can include a material selected from a group consisting of $SiH_4$, $Si_2H_6$, and $SiH_2Cl_2$, or a combination thereof.

Figure 6C:
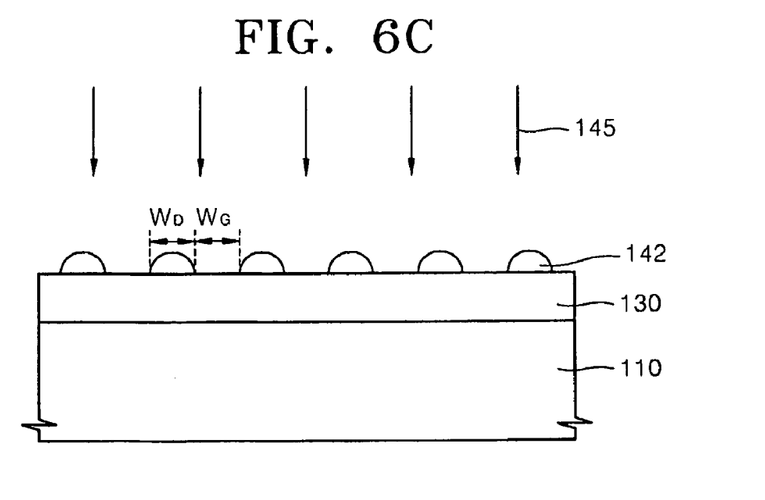

Referring to FIG. 6C, a plurality of nanodot seeds 141 are grown by again applying a nanodot source gas 145 onto a tunnel insulating layer 130 on which the nanodot seeds 141 are formed. Accordingly, formation of the nanodots 142, which are spaced apart from one another, is completed.

For example, when the nanodot seeds 141 are made of silicon, a plurality of nanodots 142 consist of crystalline silicon particles. To form the nanodots 142 of the crystalline silicon particles, the aforementioned silicon source gas is applied onto the results in which the nanodot seeds 141 are formed at a temperature in the range of about 570 C.-600 C and a pressure in the range of about 0.1-10 Torr for about 15 min-20 min. Accordingly, the nanodots 142 can be formed by growing the nanodot seeds 141. For example, a particle diameter WD of each of the nanodots 142 can be about 5 nm. An Interval WG between the nanodots 142 can be formed to maintain about 5 nm. However, the particle diameter WD of each of the nanodots 142 and Interval WG between the nanodots 142 are exemplary, and the size and spacing of the nanodots are not limited to such dimensions.

Materials forming of the nanodot seeds 141 and the nanodots 142 described above are exemplary, and the nanodot seeds 141 and the nanodots 142 are not limited to such materials. That is, the nanodots 142 can include metals, semiconductors, or a High-K material. For example, the nanodots 142 can include at least one material selected from a group consisting of: metal nano-particles made of at least one material selected from Pt, Pd, Ni, Ru, Co, Cr, Mo, W, Mn, Fe, Ru, Os, Ph, Ir, Ta, Au, Ag, and an alloy thereof; IV group semiconductor nano-particles made of a compound selected from a group of single-element compounds including Si and Ge and a group of two-element compounds including SiC and SiGe; II-VI group compound semiconductor nano-particles made of a compound selected from a group of two-element compounds including CdSe, CdTe, ZnS, ZnSe, ZnTe, ZnO, HgS, HgSe or HgTe, a group of three-element compounds including of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS or HgZnSe, and a group of four-element compounds including of HgZnTe, CdZnSeS, CdZnSeTe, CdZnSTe, CdHgSeS, CdHgSeTe, CdHgSTe, HgZnSeS, HgZnSeTe or HgZnSTe; III-V group compound semiconductor nano-particles made of a compound selected from a group of two-element compounds including GaN, GaP, GaAs, GaSb, AlN, AlP, AlAs, AlSb, InN, InP, InAs or InS, a group of three-element compounds including GaNP, GaNAs, GaNSb, GaPAs, GaPSb, AlNP, AlNAs, AlNSb, AlPAs, AlPSb, InNP, InNAs, InNSb, InPAs, InPSb or GaAlNP, and a group of four-element compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs or InAlPSb; IV-VI group compound semiconductor nano-particles made of a compound selected from a group of two-element compounds including SnS, SnSe, SnTe, PbS, PbSe or PbTe, a group of three-element compounds including of SnSeS, SnSeTe, SnSTe, PbSeS, PbSeTe, PbSTe, SnPbS, SnPbSe or SnPbTe, and a group of four-element compounds including SnPbSSe, SnPbSeTe or SnPbSTe; and a High-K material selected from $SiO_2$, $HfO_2$, $ZrO_2$, $Al_2O_3$, HfSiO, HfSiON, HfON and HfAlO.

A method of manufacturing the nanodots 142 described above is an exemplary, and it is not limited thereto. That is, the nanodots 142 can be formed using LPCVD, or can be formed by applying desired ions and then growing by heat-treatment, or can be formed using ALD or heat-treatment.

Figure 6D:
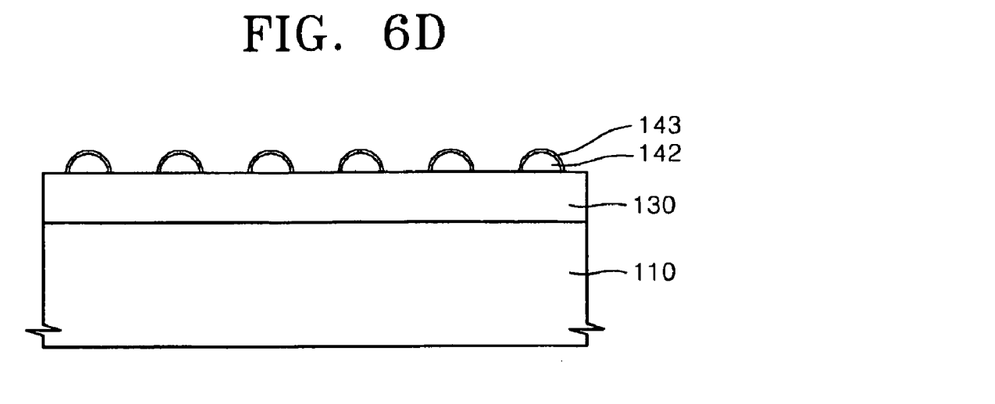

Referring to FIG. 6D, by performing a nitriding treatment on the surface of the plurality of nanodots 142, a nitride layer 143 can be formed thereon. However, the nitriding treatment process can be omitted depending on the embodiment. By performing the nitriding treatment on the surface of the nanodots 142, an undesired natural oxide layer can be prevented from being formed on the surface of the nanodots 142 while transmitting a wafer before subsequent processes are performed. While the nitriding treatment is being performed on the surface of the nanodots 142, silicon residues, which can remain on the upper surface of the tunnel insulating layer 130 between the nanodots 142, are nitrided, therefore, a dot-type arrangement in which each of the nanodots 142 are spaced apart from one another can be maintained.

Figure 6E:
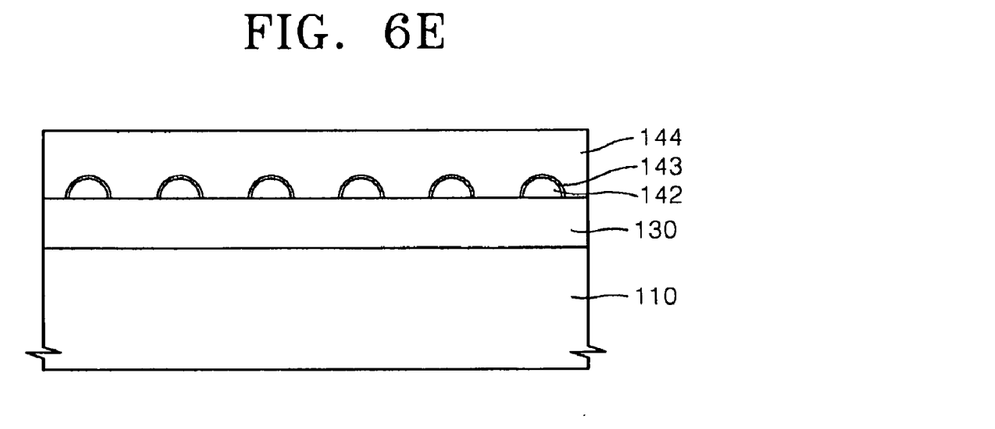

Referring to FIG. 6E, a lower trap layer 144 is formed on the tunnel insulating layer 130 including the plurality of nanodots 142. As described above, the lower trap layer 144 includes a material having a first band gap energy level that is higher than a second band gap energy level, which is a band gap energy of the nanodots 142. For example, the lower trap layer 144 can include at least one material selected from a group consisting of $SiO_2$, SiON, $Si_3N_4$, Si rich nitride (SRN), $HfO_2$, HfSiO, HfSiON, HfON HfAlO, $Al_2O_3$, and AlN. The lower trap layer 144 can be formed using LPCVD, ALD, or PECVD and can have a thickness in the range of about 2 nm-20 nm. To form the structure illustrated in FIG. 4B, a lower trap layer 144a (FIG. 4B) can be additionally formed on the lower trap layer 144 using the method illustrated FIGS. 6C through 6E.

Figure 6F:
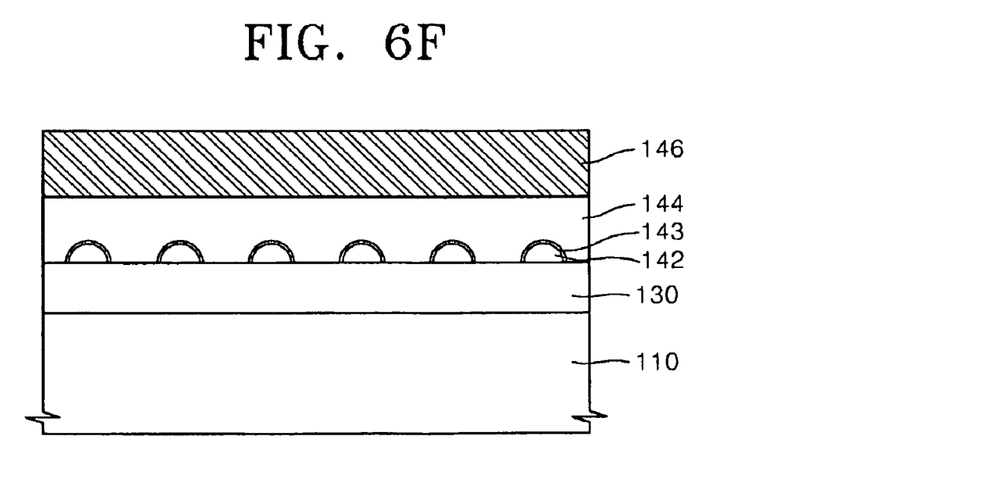

Referring to FIG. 6F, an intermediate blocking layer 146 is formed on a lower trap layer 144. As describe above, the intermediate blocking layer 146 includes a material having a third band gap energy level that is higher than a first band gap energy level. For example, the intermediate blocking layer 146 can include a material selected from a group consisting of $Al_2O_3$, $SiO_2$, $HfO_2$, $ZrO_2$, $Ta_2O_5$, LaO, LaAlO, LaHfO and HfAlO, or a combination thereof. The intermediate blocking layer 146 can be formed using physical vapor deposition (PVD), CVD or ALD. For example, the intermediate blocking layer 146 can have a thickness in the range of about 2 nm-20 nm.

Figure 6G:
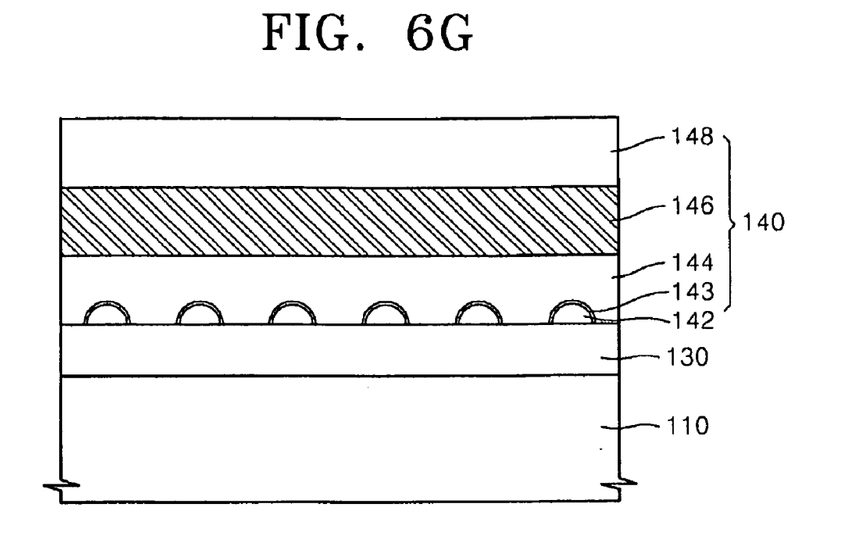

Referring to FIG. 6G, an upper trap layer 148 is formed on an intermediate blocking layer 146. As described above, the upper trap layer 148 includes a material having a first band gap energy level that is higher than a second band gap energy level. For example, the upper trap layer 148 can include at least one material selected from a group consisting of $SiO_2$, SiON, $Si_3N_4$, Si rich nitride (SRN), $HfO_2$, HfSiO, HfSiON, HfON HfAlO, $Al_2O_3$, and AlN. The upper trap layer 148 can be formed using LPCVD, ALD, or PECVD, and can be formed of the same material as the material used to form the lower trap layer 144 described above. The upper trap layer 148 can have a thickness in the range of about 2 nm-20 nm. To form the structure illustrated in FIG. 4C, an upper trap layer 148b (FIG. 4C) including the plurality of nanodots 142b can be formed using the method illustrated FIG. 6C through FIG. 6E. The upper trap layer 148b can be totally or partially formed as a multi-layer including the nanodots 142b.

As described above, a charge trap layer 140 trapping charges includes the lower trap layer 144 formed on a tunnel insulating layer 130, a plurality of nanodots 142, an intermediate blocking layer 146, and the upper trap layer 148.

Figure 6H:
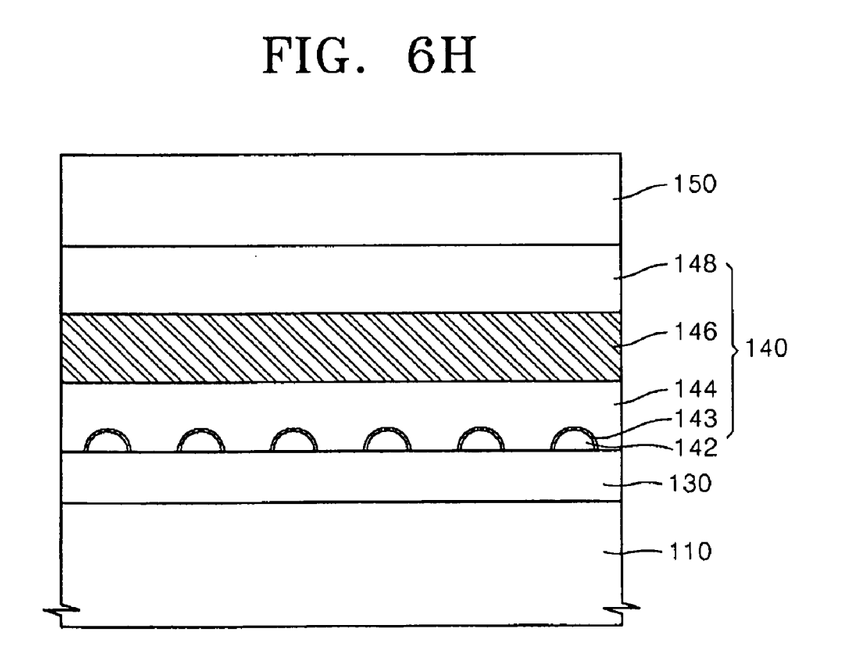

Referring to FIG. 6H, a blocking insulating layer 150 is formed on the charge trap layer 140. The blocking insulating layer 150 can be formed as a single-layer structure or a multi-layer structure having different band gap energies from one another. The blocking insulating layer 150 can be made of a material having a relatively high dielectric constant, for example, a High-K material. For example, the blocking insulating layer 150 can include a material selected from a group consisting of $Al_2O_3$, $SiO_2$, $HfO_2$, $ZrO_2$, $Ta_2O_5$, LaO, LaAlO, LaHfO, and HfAlO, or a combination thereof. The blocking insulating layer 150 can have a thickness in the range of 4 nm-50 nm and can be formed using PVD, CVD, or ALD.

Figure 6I:
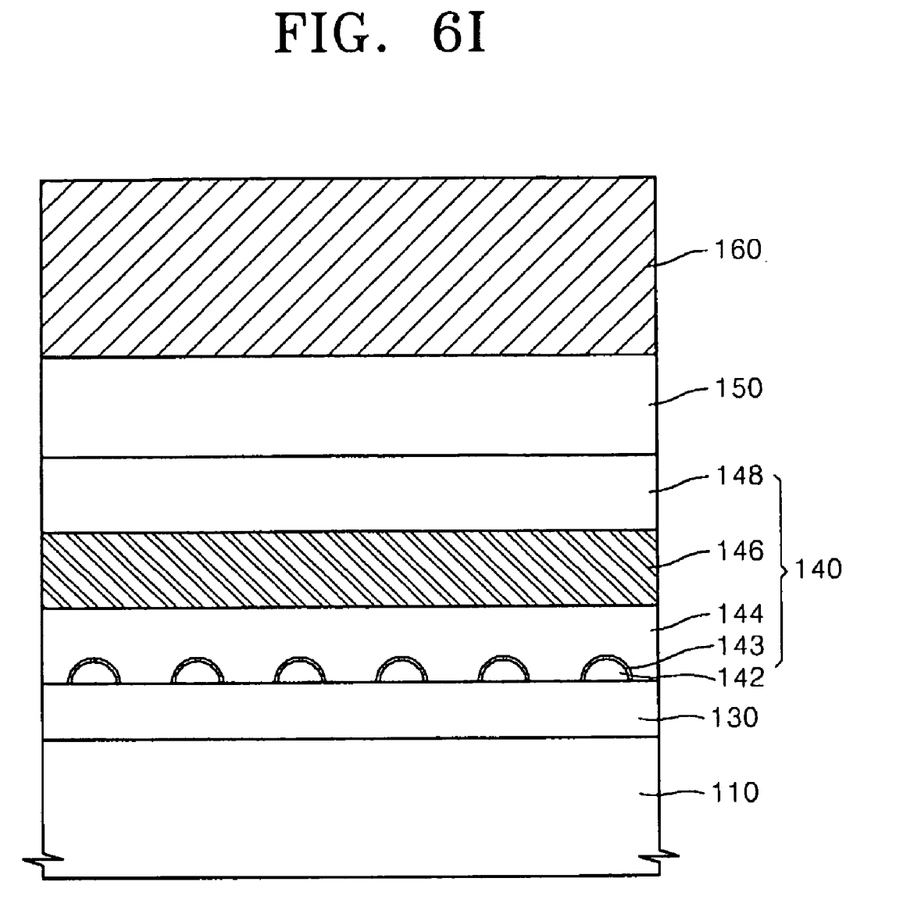

Referring to FIG. 6I, a gate electrode 160 is formed by depositing a conductive material on the blocking insulating layer 150. The gate electrode 160 can be made of at least one material selected from a group consisting of Al, Ru, TaN, TiN, W, WN, HfN, and tungsten silicide.

Subsequently, a gate structure shown in FIG. 3 is formed by sequentially patterning the gate electrode 160, the blocking insulating layer 150, the charge trap layer 140, and the tunnel insulating layer 130. Afterwards, an impurity region 120 doped with a conductive impurity, as illustrated in FIG. 3, is formed by injecting an impurity on both sides of the semiconductor substrate 110 and performing a heat-treatment. The impurity region 120 can be used as a source region and a drain region.

Table 1 shows a characteristic of a charge trap flash memory device according to an embodiment of the present invention, present as a comparison thereof with prior art examples.

TABLE 1

|  | Embodiment Of Present Invention | Example 1: TANOS | Example 2: NAN |
|---|---|---|---|
| program voltage (100 µs) | 19.6 V | 17 V | 15.5 V |
| erasing voltage (10 ms) | −19 V | −20 V | −16.2 V |
| hot temperature storage (0 cycles) |  | almost similar |  |
| hot temperature storage 1200 (cycles) | 0.1 | 1.2 V | 0.4 V |

TABLE 1-continued

|  | Embodiment Of Present Invention | Example 1: TANOS | Example 2: NAN |
|---|---|---|---|
| threshold voltage disturbance | low | high | low |
| endurance | high | low | high |
| lateral charge spreading | a little high | low | low |
| integration complexity | a little high | low | low |

As shown in Table 1, Example 1 is a flash memory having a TANOS structure illustrated in prior art FIG. 1A, and Example 2 is a flash memory having a NAN structure illustrated in prior art FIG. 1B.

Referring to table 1, the charge trap flash memory device according to an embodiment of the present invention has a higher program voltage and a lower erasing voltage than the comparative prior art examples. In particular, the charge trap flash memory device according to an embodiment of the present invention has a relatively low hot temperature storage (HTS), thereby improving hot temperature reliability of the charge trap flash memory device. The HTS was calculated from the threshold voltage measured before operating the charge trap flash memory device (i.e., at 0 cycles) under program/erasing voltages, ensuring a memory window having a predetermined voltage, and in the case in which the charge trap flash memory device is heated at a temperature of 200 C for 2 hours after being operated for 1200 cycles. Also, the charge trap flash memory device has a low threshold voltage disturbance and high endurance. On the other hand, the lateral charge spreading and integration complexity of the charge trap flash memory device according to the embodiment were a little inferior to the comparative prior art examples.

As described above, since a charge trap flash memory device according to an embodiment of the present invention has a plurality of nanodots having a low energy level, most of charges are stored in the nanodots. Accordingly, the charge trap flash memory device has a high program voltage and a low erasing voltage due to a coulomb blockade effect of the nanodots. Also, the charge trap flash memory device has an excellent HTS characteristic and a low threshold voltage disturbance due to a deep potential well and high program voltage of nanodots. According to Table 1, the lateral charge spreading was a little higher than the comparative prior art examples, but is relatively low compared to a different type of charge trap flash memory, for example, a charge trap flash memory having a hybrid structure including a nanodot, but not including an intermediate blocking layer.

According to a charge trap flash memory device and a method of manufacturing the same of the present invention, a plurality of layers having different band gap energies are formed in a charge trap layer. In particular, the charge trap layer includes a plurality of nanodots having a low band gap energy and an intermediate blocking layer having a high band gap energy.

The nanodots provide a deep charge trap level to improve retention characteristics of the charge trap flash memory device. Also, a potential well is provided by the nanodots, therefore a charge loss generated, when thermally activated charges after a program operation flow through a tunnel insulating layer, can be decreased. Also, the charge trap flash memory device includes at least one trap layer including the nanodots isolated from one another, thereby improving the charge storage capacity of the charge trap flash memory device and preventing charges from being lost through a blocking insulating layer.

Also, by forming an intermediate blocking layer having a high band gap energy in a charge trap layer, a transfer of charges between cells caused by a local connecting layer, which can be formed due to the formation of minute nanodots, and by a narrow storage location of the nanodots described above, that is, lateral charge spreading can be prevented.

Figure 7:
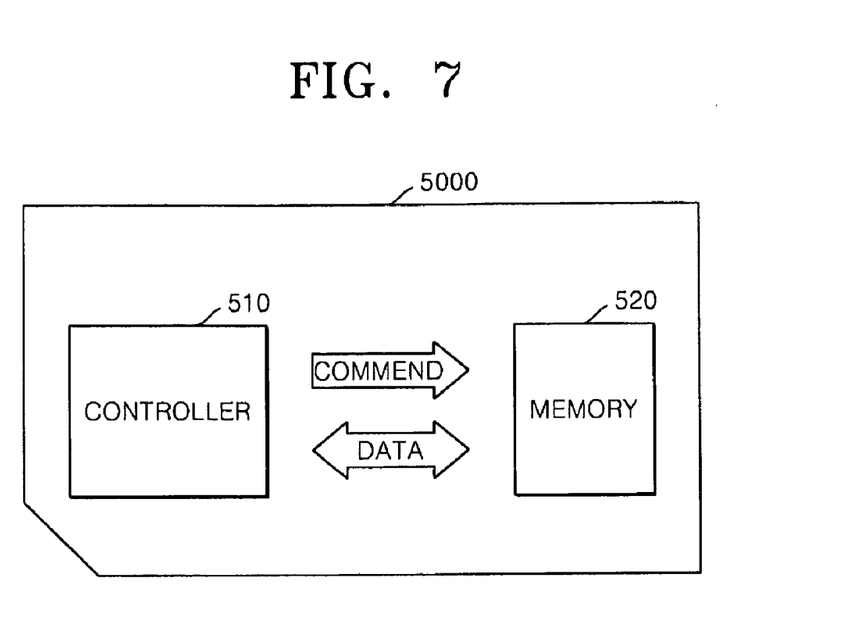
FIG. 7 is a schematic view illustrating an embodiment of a memory card according to an aspect of the present invention.

FIG. 7 is a schematic view illustrating an embodiment of a memory card 5000 according to an aspect of the present invention.

Referring to FIG. 7, a controller 510 and a memory 520 are disposed to send and receive electric signals each other. For example, when the controller 510 gives a command to the memory 520, the memory 520 can send data. The memory 520 can include the flash memory device 100 of FIG. 3. The flash memory devices according to the various embodiments of the present invention can be disposed in NAND or NOR architecture arrays in correspondence to the logic gate design, wherein such NAND and NOR arrays are generally known in the art. The memory arrays disposed in a plurality of rows and columns can have one or more memory array bank (not shown). The memory 520 can include the memory array (not shown) or the memory array bank (not shown), all of which are known in the art. The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are known in the art. The memory card 5000 can be used in memory devices as a memory card, for example, such as a memory stick card, a smart media (SM) card, a secure digital (SD) card, a mini SD card, or a multi media card (MMC).

Figure 8:
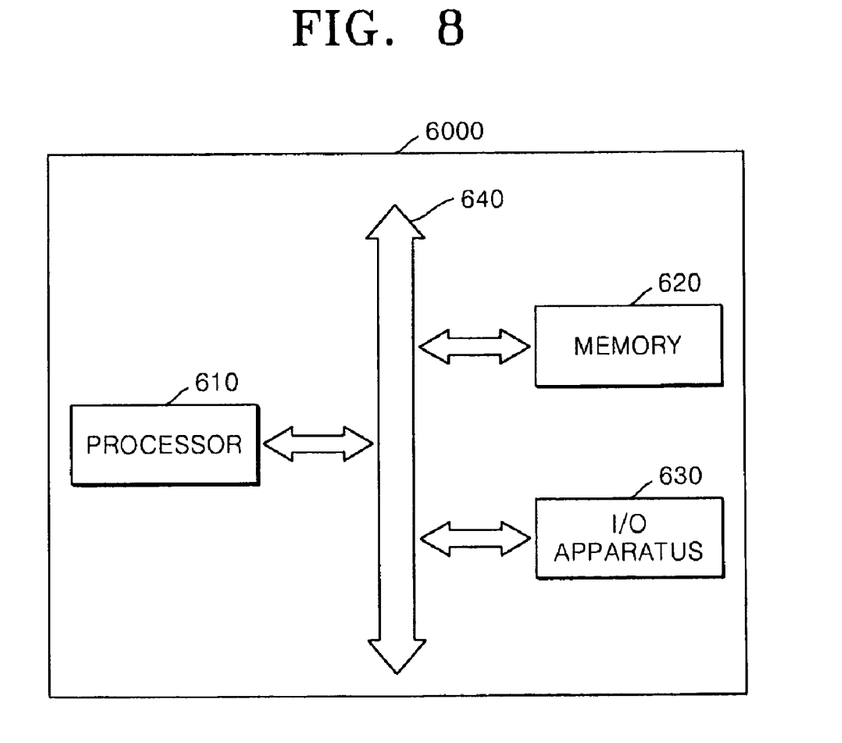
FIG. 8 is a schematic view illustrating an embodiment of a system according to an aspect of the present invention.

FIG. 8 is a schematic view illustrating an embodiment of a system 6000 according to an aspect of the present invention.

Referring to FIG. 8, a processor 610, an input/output (I/O) apparatus 630, and a memory 620 can perform data communication using a bus 640. The processor 610 executes a software program and controls the system 6000. The input/output apparatus 630 can be used to input or output data of the system 6000. The system 6000 is connected to an external apparatus, for example, a personal computer or a network, using the input/output apparatus 630, to send and receive data to and from the external apparatus. The memory 620 can include the flash memory device 100 of FIG. 3. For example, the memory 620 can store codes and data for operating the processor 610. For example, the system 6000 can be used for a mobile phone, a MP3 player, a navigation system, a portable multimedia player (PMP), a solid state disk (SSD), or a household appliance.

While embodiments in accordance with the present invention have been particularly shown and described with reference to the accompanying drawings, it will be understood by those of ordinary skill in the art that various changes in form and details can be made therein without departing from the spirit and scope of the present invention, as defined by the following claims.

What is claimed is:

1. A charge trap flash memory device comprising:
    a tunnel insulating layer formed on a semiconductor substrate;
    a charge trap layer formed on the tunnel insulating layer;
    a blocking insulating layer formed on the charge trap layer; and
    a gate electrode formed on the blocking insulating layer, wherein the charge trap layer comprises:
        a plurality of trap layers comprising a first material having a first band gap energy level;
        a plurality of nanodots spaced apart from one another, each of which is at least partially surrounded by at least one of the trap layers, the nanodots comprising a second material having a second band gap energy level that is lower than the first band gap energy level; and
        an intermediate blocking layer formed between at least two of the plurality of trap layers, the intermediate blocking layer comprising a third material having a third band gap energy level that is higher than the first band gap energy level,
    wherein at least one of the trap layers comprises a first trap layer formed to contact the tunnel insulating layer and a second trap layer formed directly on the first trap layer,
    wherein the first trap layer comprises a plurality of nanodots formed directly on the tunnel insulating layer and partially surrounded by the first material of the first trap layer, and
    wherein the second trap layer comprises a second group of the nanodots that are substantially completely surrounded by the first material.

2. The charge trap flash memory device of claim 1, wherein at least one of the trap layers comprises a third trap layer formed to be spaced apart from the tunnel insulating layer and formed to contact the blocking insulating layer;
    the third trap layer comprises nanodots formed on the blocking insulating layer and surrounded by the first material of the third trap layer.

3. The charge trap flash memory device of claim 1, wherein the first material of the plurality of trap layers comprises at least one material selected from a group consisting of $SiO_2$, SiON, $Si_3N_4$, Si rich nitride (SRN), $HfO_2$, HfSiO, HfSiON, HfON HfAlO, $Al_2O_3$, and MN.

4. The charge trap flash memory device of claim 1, wherein the nanodots comprise one of metals, semiconductors, and High-K materials.

5. The charge trap flash memory device of claim 4, wherein the nanodots comprise at least one material selected from a group consisting of: metal nano-particles made of at least one material selected from Pt, Pd, Ni, Ru, Co, Cr, Mo, W, Mn, Fe, Ru, Os, Ph, Ir, Ta, Au, Ag, and an alloy thereof; IV group semiconductor nano-particles made of a compound selected from a group of single-element compounds comprising Si and Ge and a group of two-element compounds comprising SiC and SiGe; II-VI group compound semiconductor nano-particles made of a compound selected from a group of two-element compounds comprising CdSe, CdTe, ZnS, ZnSe, ZnTe, ZnO, HgS, HgSe or HgTe, a group of three-element compounds comprising CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS or HgZnSe, and a group of four-element compounds comprising HgZnTe, CdZnSeS, CdZnSeTe, CdZnSTe, CdHgSeS, CdHgSeTe, CdHgSTe, HgZnSeS, HgZnSeTe or HgZnSTe; III-V group compound semiconductor nano-particles made of a compound selected from a group of two-element compounds including GaN, GaP, GaAs, GaSb, AlN, AlP, AlAs, AlSb, InN, InP, InAs or InS, a group of three-element compounds comprising GaNP, GaNAs, GaNSb, GaPAs, GaPSb, AlNP, AlNAs, AlNSb, AlPAs, AlPSb, InNP, InNAs, InNSb, InPAs, InPSb or GaAlNP, and a group of four-element compounds comprising GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs or InAlPSb; IV-VI group compound semiconductor nano-particles made of a compound selected from a group of two-element compounds comprising SnS, SnSe, SnTe, PbS, PbSe or PbTe, a group of three-element compounds comprising SnSeS, SnSeTe, SnSTe, PbSeS, PbSeTe, PbSTe, SnPbS, SnPbSe or SnPbTe, and a group of four-element compounds comprising SnPbSSe, SnPbSeTe or SnPbSTe; and a High-K material selected from $SiO_2$, $HfO_2$, $ZrO_2$, $Al_2O_3$, HfSiO, HfSiON, HfON and HfAlO.

6. The charge trap flash memory device of claim 4, wherein each of the nanodots further comprises a nitride layer on the surface of the nanodots.

7. The charge trap flash memory device of claim 1, wherein the intermediate blocking layer comprises a material selected from a group consisting of $Al_2O_3$, $SiO_2$, $HfO_2$, $ZrO_2$, $Ta_2O_5$, LaO, LaAlO, LaHfO and HfAlO, or a combination thereof.

8. The charge trap flash memory device of claim 1, wherein the tunnel insulating layer comprises a material selected from a group consisting of $SiO_2$, $Si_3N_4$, SiON, $HfO_2$, HfSiO, $Al_2O_3$, and $ZrO_2$, or a combination thereof.

9. The charge trap flash memory device of claim 1, wherein the blocking insulating layer comprises a material selected from a group consisting of $Al_2O_3$, $SiO_2$, $HfO_2$, $ZrO_2$, $Ta_2O_5$, LaO, LaAlO, LaHfO, and HfAlO, or a combination thereof.

10. The charge trap flash memory device of claim 1, wherein the gate electrode comprises a material selected from a group consisting of Al, Ru, TaN, TiN, W, WN, HfN and tungsten silicide, or a combination thereof.

11. A memory card comprising:
a memory comprising one or more flash memory device comprising:
a tunnel insulating layer formed on a semiconductor substrate;
a charge trap layer formed on the tunnel insulating layer;
a blocking insulating layer formed on the charge trap layer; and
a gate electrode formed on the blocking insulating layer, wherein the charge trap layer comprises:
a plurality of trap layers comprising a first material having a first band gap energy level;
a plurality of nanodots spaced apart from one another, each of which is at least partially surrounded by at least one of the trap layers, the nanodots comprising a second material having a second band gap energy level that is lower than the first band gap energy level; and
an intermediate blocking layer formed between at least two of the plurality of trap layers, the intermediate blocking layer comprising a third material having a third band gap energy level that is higher than the first band gap energy level,
wherein at least one of the trap layers comprises a first trap layer formed to contact the tunnel insulating layer and a second trap layer formed directly on the first trap layer, and
wherein the first trap layer comprises a first group of nanodots formed directly on the tunnel insulating layer and partially surrounded by the first material of the first trap layer, and
wherein the second trap layer comprises a second group of the nanodots that are substantially completely surrounded by the first material; and
a controller configured to control the memory, including sending and receiving data to and from the memory.

12. A system comprising:
a memory comprising one or more flash memory device comprising:
a tunnel insulating layer formed on a semiconductor substrate;
a charge trap layer formed on the tunnel insulating layer;
a blocking insulating layer formed on the charge trap layer; and
a gate electrode formed on the blocking insulating layer, wherein the charge trap layer comprises:
a plurality of trap layers comprising a first material having a first band gap energy level;
a plurality of nanodots spaced apart from one another, each of which is at least partially surrounded by at least one of the trap layers, the nanodots comprising a second material having a second band gap energy level that is lower than the first band gap energy level; and
an intermediate blocking layer formed between at least two of the plurality of trap layers, the intermediate blocking layer comprising a third material having a third band gap energy level that is higher than the first band gap energy level,
wherein at least one of the trap layers comprises a first trap layer formed to contact the tunnel insulating layer and a second trap layer formed directly on the first trap layer, and
wherein the first trap layer comprises a plurality of nanodots formed directly on the tunnel insulating layer and partially surrounded by the first material of the first trap layer, and
wherein the second trap layer comprises a second group of the nanodots that are substantially completely surrounded by the first material;
a processor communicating with the memory through a bus; and
an input/output apparatus communicating with the bus.

* * * * *